(12) United States Patent
Ikisawa et al.

(10) Patent No.: US 7,699,965 B2
(45) Date of Patent: Apr. 20, 2010

(54) ZINC OXIDE-BASED TRANSPARENT CONDUCTOR AND SPUTTERING TARGET FOR FORMING THE TRANSPARENT CONDUCTOR

(75) Inventors: Masakatsu Ikisawa, Ibaraki (JP); Masataka Yahagi, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 24 days.

(21) Appl. No.: 12/282,933

(22) PCT Filed: Feb. 19, 2007

(86) PCT No.: PCT/JP2007/052928

§ 371 (c)(1),
(2), (4) Date: Sep. 15, 2008

(87) PCT Pub. No.: WO2007/108266

PCT Pub. Date: Sep. 27, 2007

(65) Prior Publication Data

US 2009/0085014 A1    Apr. 2, 2009

(30) Foreign Application Priority Data

Mar. 17, 2006   (JP) .............................. 2006-073822

(51) Int. Cl.
*B22D 7/00*   (2006.01)
(52) U.S. Cl. ............... 204/298.02; 252/510; 252/519.5; 428/64.1; 106/425
(58) Field of Classification Search ............. 252/78; 438/48
See application file for complete search history.

(56) References Cited

U.S. PATENT DOCUMENTS

| | | | |
|---|---|---|---|
| 5,672,427 | A | 9/1997 | Hagiwara et al. |
| 6,528,442 | B1 | 3/2003 | Kuwano et al. |
| 6,569,548 | B2 | 5/2003 | Yamamoto et al. |
| 7,279,211 | B2 | 10/2007 | Yahagi et al. |
| 2002/0025440 | A1* | 2/2002 | Yamamoto et al. ........ 428/432 |
| 2006/0147740 | A1 | 7/2006 | Hosono et al. |
| 2007/0098626 | A1 | 5/2007 | Shindo et al. |
| 2008/0299415 | A1 | 12/2008 | Hosono et al. |

FOREIGN PATENT DOCUMENTS

| WO | 2007/000867 A1 | 1/2007 |
|---|---|---|
| WO | 2007/000878 A1 | 1/2007 |

OTHER PUBLICATIONS

Sumiya et a. (SIMS analysis of ZnO films co-doped with N And Ga by temperature gradient pulsed laser deposition Applied Surface Science 223 (2004) 206-209).*
Gopalakrishnan et al. (Comparison of ZnO:GaN film on Si(111) and Si(100) substrates by pulsed laser deposition Physica B 376-377 (2006) 756-759).*
Yuan et al. Materials Letters 58 (2004) 3741-3744.*
Look et al. Phys. Stat. sol. (a) 201, No. 10, 2203-2212 (2004).*
One Page English Language Abstract of JP 2002-075062, Mar. 15, 2002.
One Page English Language Abstract of JP 04-219359, Aug. 10, 1992.
One Page English Language Abstract of JP 09-320344, Dec. 12, 1997.
Unpublished Co-Pending U.S. Appl. No. 12/307,380, which is the national phase of PCT/JP2007/060487 filed May 23, 2007.
Unpublished Co-Pending U.S. Appl. No. 11/933,944, which is the national phase of PCT/JP2006/311270 filed Jun. 6, 2006.
Unpublished Co-Pending U.S. Appl. No. 11/994,025, which is the national phase of PCT/JP2006/310734 filed May 30, 2006.
Unpublished Co-Pending U.S. Appl. No. 12/094,024, which is the national phase of PCT/JP2006/322944 filed Nov. 17, 2006.
esp@cenet database, One Page English Abstract of JP 61-205619 A, Sep. 11, 1986.
esp@cenet database, One Page English Abstract of JP 2001-035252 A, Feb. 9, 2001.

* cited by examiner

*Primary Examiner*—Harold Y Pyon
*Assistant Examiner*—Timothy Chiang
(74) *Attorney, Agent, or Firm*—Howson & Howson LLP

(57) ABSTRACT

Proposed is a zinc oxide-based transparent conductor characterized in having zinc oxide as its primary component, containing an element at 1 to 10 atomic % which has a smaller ion radius than zinc in the zinc oxide and serves as an n-type dopant for the zinc oxide, and containing nitrogen in which the atomicity ratio of nitrogen in relation to the n-type dopant (nitrogen/n-type dopant) is 0.3 to 0.6. In the development of a transparent conductor that does not contain In, which is an expensive raw material with concern of resource depletion, the limit of the conventional development technique known as the single-dopant method is exceeded, a guide to dopant selection as a specific means for realizing the co-doping theory is indicated, and a transparent conductor having low resistivity is provided.

18 Claims, No Drawings

ZINC OXIDE-BASED TRANSPARENT CONDUCTOR AND SPUTTERING TARGET FOR FORMING THE TRANSPARENT CONDUCTOR

BACKGROUND OF THE INVENTION

The present invention relates to a zinc oxide-based transparent conductor having zinc oxide as its primary component, and a sputtering target for forming the foregoing transparent conductor. Incidentally, the term "transparent conductor" as used herein includes a transparent conductive film.

Today, the material that is being used most as a transparent electrode of flat panel displays and the like is ITO (Indium Tin Oxide), which is obtained by doping indium oxide with an appropriate amount of tin.

The reason why ITO plays the leading part in a transparent conductor is that the various characteristics of ITO such as low resistivity and high transmittance in the visible light region, which are required in a transparent conductor, are superior in comparison to transparent conductors prepared from other materials.

Nevertheless, In (indium) as the raw material to be used in ITO entails problems in that the cost of the end product will increase because indium is expensive, and the supply of materials may become impossible due to resource depletion because indium is a scarce resource. Although the development of a zinc oxide-based transparent conductor having zinc oxide as its primary component is being actively pursued as the development of the substitute material of ITO, there is still a problem in that the resistivity is significantly high in comparison to ITO.

The reason for this is that the conventional development policy of zinc oxide-based transparent conductive materials was only based on the search of an optimal single dopant. In other words, the foregoing policy is to find an element from a periodical table that will serve as an n-type dopant and emit electrons as a result of doping the zinc oxide as the parent material with such element. Specifically, for example, in most cases, a target doped with a candidate element having an atomic valence that is greater than bivalence, which is the valence of zinc, in an appropriate range of concentration is prepared, and this is subject to sputter-deposition to evaluate the resistivity of the film.

As a result of this development policy, although candidate dopants having an atomic valence of trivalence (refer to Patent Document 1) and tetravalence (refer to Patent Document 2) were discovered, the actual condition is that the resistivity of such candidate dopants is far inferior to ITO.

Meanwhile, it has been reported recently that a zinc oxide-based transparent conductor with low resistivity was developed by applying the so-called co-doping theory (refer to Patent Document 3). The subject matter thereof merely requires that an n-type dopant having a concentration above a specified level is contained in an amount that is greater than a p-type dopant.

As it stands now, there have been no other reports in the past in addition to the foregoing report which actually succeeded in preparing a zinc oxide-based transparent conductor with low resistivity, though they have simply satisfied the foregoing requirement.

In addition, although the foregoing report refers to the Metal Organic Chemical Vapor Deposition (MOCVD) method and Molecular Beam Epitaxy (MBE) method in the examples as the method of manufacturing a zinc oxide-based transparent conductor, both of these methods are inappropriate for preparing a large-area transparent conductive film.

[Patent Document 1] Japanese Patent Laid-Open Publication No. S61-205619

[Patent Document 2] Japanese Patent Laid-Open Publication No. S62-154411

[Patent Document 3] Japanese Patent Laid-Open Publication No. 2002-50229

SUMMARY OF THE INVENTION

As described above, the search for an optimal single dopant in the development of a zinc oxide-based transparent conductor as the substitute material of ITO that does not contain In, which is an expensive raw material with concern of resource depletion, has already reached its limit. Moreover, in the development based on the co-doping theory, the subject matter thereof is ambiguous, and the current status is that the adopted manufacturing methods are unable to manufacture a large-area transparent conductor that is suitable for industrial application.

The present invention was devised in view of the foregoing problems. Thus, an object of the present invention is to provide a zinc oxide-based transparent conductive film with low resistivity that is comparable to ITO and which can be manufactured in a large area.

As a result of intense study to overcome the foregoing problems, the present inventors succeeded in realizing a zinc oxide-based transparent conductive film with low resistivity that is comparable to ITO and which can be manufactured in a large area by setting the type, range of concentration and relative value of concentration of the n-type dopant and the p-type dopant to be within an appropriate range, and further adopting an appropriate doping raw material and doping method. The present inventors thereby conceived the present invention.

The co-doping theory utilizes the effect of lowering the respective impurity levels based on mutual interaction by doping both the n-type dopant and the p-type dopant, and in particular is being reviewed for application to realize p-type zinc oxide which is considered to be difficult to manufacture. In other words, lowering the impurity level of the p-type dopant is to provide numerous holes, which exceeds the effect of normally existing the n-type dopant, and the results lead p-type zinc oxide to be realized.

Meanwhile, the present invention is unique in that it took particular note of n-type impurities. Specifically, since the impurity level of the n-type dopant is also lowered, the theoretical rationale that the present invention can be realized is the application of the foregoing effect to a zinc oxide-based transparent conductor.

The reason why the co-doping theory is considered to be effective in manufacturing an n-type zinc oxide-based transparent conductor is based on the discovery that, by introducing an n-type dopant and a p-type dopant at a ratio of 2:1 to zinc oxide, a compound is formed between the two dopants, the n-type impurity level is lowered further based on mutual interaction, and the activation rate of n-type impurities will increase. Thus, it is possible to reduce the doping amount of n-type impurities for obtaining a certain level of carrier concentration, and reduce the scattering of ionized impurities.

Nevertheless, the co-doping theory is only a theory, and it is hypothecating an ideal condition that is different from the actual condition for calculating the impurity level. In other words, the co-doping theory is based on the premise that the n-type dopant and the p-type dopant are respectively substituted with appropriate atoms and form a prescribed atomic arrangement.

Specifically, for example, in a case where the n-type dopant is gallium and the p-type dopant is nitrogen, in the co-doping theory, calculating the impurity level is based on the assumed ideal condition where the gallium is completely substituted with zinc and the nitrogen is completely substituted with oxygen in a lattice position.

In addition, the co-doping theory merely shows the calculation result of the impurity level once the foregoing substitution is realized, and it does not explain whether this kind of substitution actually occurs, nor does it refer to or suggest any means for realizing such substitution.

In fact, the present inventors identified that there are elements in which the foregoing ideal substitution is difficult such as the dopant getting caught between the lattices, and elements that in which the foregoing ideal substitution can be attained relatively easily, depending on the type, combination and introduction method of the dopants to be introduced.

Specifically, since the ion radius of nitrogen that is suitable as the p-type dopant is larger than that of oxygen, when nitrogen is introduced, zinc oxide will be subject to the influence of strains toward the direction of partially enlarging crystal lattice.

Moreover, since the n-type dopant similarly has an ion radius that is greater than that of zinc to which it is to substitute, and zinc oxide will be further subject to the influence of strains toward the direction in which the crystal lattice is enlarged, when the doping amount is increased, the appropriate substitution of these dopants to the lattice position will no longer be possible, the dopants may get caught between the lattices, and the ideal condition hypothesized under the co-doping theory can no longer be realized.

Thus, when using nitrogen as the p-type dopant, an element having an ion radius that is smaller than the ion radius of zinc is used as the n-type dopant. Consequently, the dopants are substituted at the lattice position based on the alleviation effect of the lattice strain caused by the introduction of the dopants, and the effect of the co-doping theory was thereby realized.

Moreover, the present inventors also discovered that the ratio of the n-type dopant and p-type dopant does not necessarily have to be within the range of 2:1, which is the optimal value of the co-doping theory, and the effect is yielded across a certain range.

Based on the foregoing discovery, the present invention provides:

1) A zinc oxide-based transparent conductor characterized in having zinc oxide as its primary component, containing an element at 1 to 10 atomic % which has a smaller ion radius than the zinc in the zinc oxide and serves as an n-type dopant for the zinc oxide, and containing nitrogen in which the atomicity ratio of nitrogen in relation to the n-type dopant (nitrogen/n-type dopant) is 0.3 to 0.6.

Incidentally, the atomic % of the n-type dopant means the ratio of the number of atoms of the n-type dopant in relation to the total number of atoms of the zinc element as the constituent element other than oxygen and nitrogen in the material, and the n-type dopant (hereinafter the same). Moreover, the atomicity ratio in relation to the n-type dopant of nitrogen is obtained by dividing the number of atoms of nitrogen by the number of atoms of the n-type dopant. Thus, if the atomicity ratio in relation to the n-type dopant of nitrogen is 0.5, this means that the number of atoms of nitrogen is half the number of atoms of the n-type dopant (hereinafter the same).

The present invention additionally provides:

2) The zinc oxide-based transparent conductor according to 1) above, wherein the element to serve as the n-type dopant is contained at 2 atomic % to 8 atomic %; and 3) The zinc oxide-based transparent conductor according to 1) or 2) above, wherein the n-type dopant is gallium and/or aluminum.

The present invention further provides:

4) A sputtering target for forming a zinc oxide-based transparent conductor characterized in having zinc oxide as its primary component, containing an element at 1 to 10 atomic % which has a smaller ion radius than zinc in the zinc oxide and serves as an n-type dopant for the zinc oxide, and containing nitrogen in which the atomicity ratio of nitrogen in relation to the n-type dopant (nitrogen/n-type dopant) is 0.3 to 0.6;

5) The sputtering target for forming a zinc oxide-based transparent conductor according to 4) above, wherein nitrogen is contained as gallium nitride;

6) The sputtering target for forming a zinc oxide-based transparent conductor according to 4) or 5) above, wherein the element to serve as the n-type dopant is contained at 2 atomic % to 8 atomic %; and 7) The sputtering target for forming a zinc oxide-based transparent conductor according to any one of 4) to 6) above, wherein the n-type dopant is gallium and/or aluminum.

The present invention yields the effect of dramatically improving the conductive property by doping zinc oxide with an n-type dopant having a smaller ion radius than the ion radius of zinc and nitrogen as the p-type dopant within an appropriate range of concentration, and thereby obtains resistivity that is equivalent to conventional ITO.

Further, by supplying nitrogen in the form of gallium nitride for doping the zinc oxide, the present invention also yields an effect of being able to prepare a sputtering target that is suitable in manufacturing a large-area transparent conductor.

Accordingly, even without having to use In, which is an expensive raw material with concern of resource depletion, it is possible to provide a new transparent conductor having the necessary characteristics as a transparent conductor such as low resistivity that could not be realized with the conventional methods.

DETAILED DESCRIPTION OF THE INVENTION

The appropriate range of concentration of the transparent conductor of the present invention was sought by preparing a sputtering target by adding a chemical compound to serve as the dopant to zinc oxide in an appropriate amount and sintering the mixture, and measuring the resistivity of the transparent conductor film obtained as a result of sputtering the foregoing sputtering target.

If the concentration of the n-type dopant to be added to zinc oxide is less than 1 atomic %, the concentration of electrons emitted from the dopant will not be a sufficiently high value, and it will not be possible to lower the resistivity.

Meanwhile, if the concentration of the n-type dopant exceeds 10 atomic %, the resistivity of the film will increase due to adverse effects such as the scattered ionized impurities caused by the added dopant, or the impurities not being ionized and remaining neutral and existing in the zinc oxide without contributing to the emission of electrons.

Further, if the atomicity ratio in relation to the n-type dopant of nitrogen is less than 0.3, the effect of lowering the n-type impurity level based on the addition of the p-type dopant is minimal. Contrarily, if the atomicity ratio in relation to the n-type dopant of nitrogen exceeds 0.6, the compensation effect of the n-type dopant based on the addition of the p-type dopant will become great and reduce the number of electrons that contribute to the conduction, and this will also lead to increased resistivity.

Accordingly, by obtaining a zinc oxide-based transparent conductor characterized in having zinc oxide as its primary component, containing an element at 1 to 10 atomic % which has a smaller ion radius than zinc in the zinc oxide and serves as an n-type dopant for the zinc oxide, and containing nitrogen in which the atomicity ratio in relation to the n-type dopant is 0.3 to 0.6, it is possible to obtain a transparent conductor having stable and low resistivity.

As a method of manufacturing a target to be used as the sputtering target, for instance, if the n-type dopant is gallium, the foregoing target can be manufactured by weighing and mixing $Ga_2O_3$ powder, GaN powder and ZnO powder in appropriate amounts so that the concentration of the respective elements becomes a prescribed value, and retaining the mixed powder for 2 hours at a temperature of 950° C. and a pressure of 300 kgf/cm² according to the hot pressing method.

When using $Al_2O_3$ as another n-type dopant, for example, the foregoing target can be manufactured by adding $Al_2O_3$ powder in substitute for or in addition to the $Ga_2O_3$ powder.

A film that is formed by sputtering the foregoing target will be a film having the same composition as the target, and such film will become a transparent conductive film with low resistivity by setting the composition to be in an appropriate range.

The target may also be formed as an integral sputtering target. In this case, the mosaic targets may be combined or the respective targets of zinc oxide, aluminum oxide, and gallium nitride may be independently formed and arranged to set the film composition as a result of sputtering to be ultimately within a prescribed range.

EXAMPLES

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.

Example 1

The respective raw material powders were weighed so that $ZnO:Ga_2O_3:GaN=98.0:0.5:1.0$ (ratio of number of molecules; the total does not necessary add up to 100), a zirconia ball of a diameter of 3 mm φ was used and the raw material powder was pulverized with an attritor for approximately one hour, the slurry raw material having an average grain size of 1 μm or less was screened with a 330 mesh sieve, and thereafter retained in a drying oven at 120° C. for 24 hours to evaporate the moisture.

The dried raw material powder was further screened with a 60 mesh sieve, and mixed with a Waring blender so that the raw material became sufficiently uniform.

Subsequently, 250 g (filling amount) of raw material powder was set in a small die of 85 f, and, while flowing Ar, the temperature was raised from room temperature to 900° C. at a rate of temperature increase of 10° C./min, and from 900 to 950° C. at a rate of temperature increase of 5° C./min, the raw material powder was retained for 30 minutes at 950° C., and thereafter pressurized for 10 minutes by applying pressure from 0 to 300 kgf/cm².

After retaining the raw material powder for 2 hours in a condition of 950° C. and 300 kgf/cm², the application of heat of the furnace was stopped, and the raw material powder was naturally cooled. After the temperature fell below 100° C., pressure was applied for 10 minutes and returned to 0, and the target was removed from the furnace. The removed target was processed to have a diameter of 50 mm and a thickness of 7 mm in order to obtain a sputtering target.

The obtained target was subject to sputter-deposition by adjusting the deposition time so that the film thickness would be approximately 150 nm under the condition of an Ar atmosphere of 0.5 Pa, Ar flow rate of 12 sccm, Corning #1737 glass as the substrate, substrate temperature of 200° C., and distance between the substrate and target of 80 mm. The film thickness of the obtained film was measured, and the film resistivity was evaluated based on Hall measurement. The obtained results are shown in Table 1.

Example 2 to Example 6

With respect to Example 2 to Example 6, only the ratios of the number of molecules of $ZnO:Ga_2O_3:GaN$ were respectively different at 95.0:1.75:1.5, 95.0:1.5:2.0, 95.0:1.25:2.5, 95.0:1.0:3.0, and 92.0:2.0:4.0, and the other conditions such as the target manufacture and sputtering conditions were the same as Example 1. The obtained results are similarly shown in Table 1.

Example 7 to Example 12

With respect to Example 7 to Example 12, ZnO, $Al_2O_3$, and GaN were used as the raw material powder, and the ratios of the number of molecules of $ZnO:Al_2O_3:GaN$ were respectively set to 98.0:0.5:1.0, 95.0:1.75:1.5, 95.0:1.5:2.0, 95.0:1.25:2.5, 95.0:1.0:3.0, and 92.0:2.0:4.0.

The other conditions such as the target manufacture and sputtering were the same as Example 1. The obtained results are similarly shown in Table 1.

Comparative Example 1 to Comparative Example 6

With respect to Comparative Example 1 to Comparative Example 6, ZnO, $In_2O_3$, and GaN were used as the raw material powder, and the other conditions were the same as Example 1. The obtained results are similarly shown in Table 1. The In material used in the Comparative Examples had an ion radius that is larger than that of Zn.

TABLE 1

| Example No. | n-type dopant element | conentration rate (atomic %) | nitrogen/Ga + Al (atomicity ratio) | resistivity (mΩcm) |
|---|---|---|---|---|
| Example 1 | Ga | 2 | 0.5 | 0.68 |
| Example 2 | Ga | 5 | 0.3 | 0.29 |
| Example 3 | Ga | 5 | 0.4 | 0.21 |
| Example 4 | Ga | 5 | 0.5 | 0.18 |
| Example 5 | Ga | 5 | 0.6 | 0.35 |
| Example 6 | Ga | 8 | 0.5 | 0.85 |
| Example 7 | Al and Ga | 2 | 0.5 | 0.65 |
| Example 8 | Al and Ga | 5 | 0.3 | 0.26 |
| Example 9 | Al and Ga | 5 | 0.4 | 0.19 |
| Example 10 | Al and Ga | 5 | 0.5 | 0.17 |

TABLE 1-continued

| Example No. | n-type dopant element | conentration rate (atomic %) | nitrogen/Ga + Al (atomicity ratio) | resistivity (mΩcm) |
|---|---|---|---|---|
| Example 11 | Al and Ga | 5 | 0.6 | 0.33 |
| Example 12 | Al and Ga | 8 | 0.5 | 0.83 |
| Comperative Example 1 | In | 2 | 0.5 | 2.58 |
| Comperative Example 2 | In | 5 | 0.3 | 1.55 |
| Comperative Example 3 | In | 5 | 0.4 | 1.23 |
| Comperative Example 4 | In | 5 | 0.5 | 0.98 |
| Comperative Example 5 | In | 5 | 0.6 | 2.83 |
| Comperative Example 6 | In | 8 | 0.5 | 3.88 |

Summary of Examples and Comparative Examples

As shown above, Example 1 to Example 6 are zinc oxide-based transparent conductive (sputtered films) in which 2 to 8 atomic % of gallium was included as the n-type dopant, and nitrogen was included as N/Ga (atomicity ratio) in a range of 0.3 to 0.6.

The resistivity of these films was within the range of 0.18 to 0.85 mΩcm, and showed superior conductive property. Moreover, the transmittance of all films was in a range of 90% or higher in the visible light region, and preferable zinc oxide-based transparent conductive films were obtained.

Example 7 to Example 12 are zinc oxide-based transparent conductive (sputtered films) in which 2 to 8 atomic % of aluminum and gallium were included as the n-type dopant, and nitrogen was included as N/Ga (atomicity ratio) in a range of 0.3 to 0.6.

The resistivity of these films was within the range of 0.17 to 0.83 mΩcm, and showed superior conductive property. Moreover, the transmittance of all films was in a range of 90% or higher in the visible light region, and preferable zinc oxide-based transparent conductive films were obtained.

Meanwhile, Comparative Examples 1 to 6 are cases where indium having an ion radius that is greater than that of zinc was used as the dopant. The indium content was set to be within the same range as the Examples, and nitrogen was also included as N/Ga (atomicity ratio) in the range of 0.3 to 0.6, but the resistivity was 0.98 to 3.88 mΩcm, and all cases resulted in inferior conductive property in comparison to the Examples.

Accordingly, it is evident that the Examples of the present invention improve the conductive property and are effective as a transparent conductor.

The present invention is extremely effective as a transparent conductor in that a low-resistivity, large-area transparent conductor that could not be realized with conventional methods can be realized without having to use In, which is an expensive raw material with concern of resource depletion, by performing sputter-deposition to a zinc oxide-based target.

The invention claimed is:

1. A sputtering target for forming a zinc oxide-based transparent conductor comprising zinc oxide as its primary component, an element at 1 to 10 atomic % which has a smaller ion radius than zinc in the zinc oxide and serves as an n-type dopant for the zinc oxide, and containing nitrogen in which the atomicity ratio of nitrogen in relation to the n-type dopant (nitrogen/n-type dopant) is 0.3 to 0.6, and wherein the nitrogen is contained as gallium nitride.

2. The sputtering target for forming a zinc oxide-based transparent conductor according to claim 1, wherein the element to serve as the n-type dopant is contained at 2 atomic % to 8 atomic %.

3. The sputtering target for forming a zinc oxide-based transparent conductor according to claim 2, wherein the n-type dopant is gallium and/or aluminum.

4. The sputtering target for forming a zinc oxide-based transparent conductor according to claim 1, wherein the n-type dopant is gallium or aluminum, or gallium and aluminum.

5. The sputtering target for forming a zinc oxide-based transparent conductor according to claim 1, wherein the element to serve as the n-type dopant is contained at 2 atomic % to 8 atomic %.

6. The sputtering target for forming a zinc oxide-based transparent conductor according to claim 5, wherein the n-type dopant is gallium or aluminum, or gallium and aluminum.

7. The sputtering target for forming a zinc oxide-based transparent conductor according to claim 1, wherein the n-type dopant is gallium or aluminum, or gallium and aluminum.

8. A sputtering target for forming a transparent conductor, consisting of a sputtering target body consisting of zinc oxide as its primary component, 1 to 10 atomic % of an element which has a smaller ion radius than zinc in the zinc oxide and serves as an n-type dopant for the zinc oxide, and nitrogen in which the atomicity ratio of nitrogen in relation to the n-type dopant (number of atoms of nitrogen/number of atoms of the n-type dopant) is 0.3 to 0.6.

9. A sputtering target according to claim 8, wherein the n-type dopant is gallium.

10. A sputtering target according to claim 9, wherein nitrogen is contained as gallium nitride.

11. A sputtering target according to claim 10, wherein the sputtering target body consists of a hot-pressed mixture of ZnO, $Ga_2O_3$ and GaN powders.

12. A sputtering target according to claim 11, wherein said sputtering target body is such that, when subjected to sputter-deposition, material deposited from said sputtering target body forms an n-type zinc oxide-based transparent conductor of low resistivity within a range of 0.18 to 0.85 mΩcm and of high transmittance of 90% or higher of light in the visible light region.

13. A sputtering target according to claim 8, wherein the n-type dopant is aluminum.

14. A sputtering target according to claim 8, wherein the n-type dopant is gallium and aluminum.

15. A sputtering target according to claim 14, wherein nitrogen is contained as gallium nitride.

16. A sputtering target according to claim 15, wherein the sputtering target body consists of a hot-pressed mixture of ZnO, $Al_2O_3$ and GaN powders.

17. A sputtering target according to claim 16, wherein said sputtering target body is such that, when subjected to sputter-deposition, material deposited from said sputtering target body forms an n-type zinc oxide-based transparent conductor of low resistivity within a range of 0.17 to 0.83 mΩcm and of high transmittance of 90% or higher of light in the visible light region.

18. A sputtering target according to claim 8, wherein the element to serve as the n-type dopant is contained at 2 atomic % to 8 atomic %.

* * * * *